(12) United States Patent
Das et al.

(10) Patent No.: US 9,955,254 B2
(45) Date of Patent: Apr. 24, 2018

(54) SYSTEMS AND METHODS FOR PREVENTING DISTORTION DUE TO SUPPLY-BASED MODULATION INDEX CHANGES IN AN AUDIO PLAYBACK SYSTEM

(71) Applicant: Cirrus Logic International Semiconductor Ltd., Edinburgh (GB)

(72) Inventors: Tejasvi Das, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 82 days.

(21) Appl. No.: 14/952,222

(22) Filed: Nov. 25, 2015

(65) Prior Publication Data

US 2017/0150257 A1    May 25, 2017

(51) Int. Cl.
| | |
|---|---|
| H03G 3/00 | (2006.01) |
| H04R 3/00 | (2006.01) |
| H03F 3/38 | (2006.01) |
| H03G 3/30 | (2006.01) |

(52) U.S. Cl.
CPC ............ H04R 3/007 (2013.01); H03G 3/004 (2013.01); H03G 3/007 (2013.01); H03G 3/3005 (2013.01)

(58) Field of Classification Search
USPC ....................................... 330/10, 207 A, 251
See application file for complete search history.

(56) References Cited

U.S. PATENT DOCUMENTS

| | | |
|---|---|---|
| 4,446,440 A | 5/1984 | Bell |
| 4,493,091 A | 1/1985 | Gundry |
| 4,890,107 A | 12/1989 | Pearce |
| 4,972,436 A | 11/1990 | Halim et al. |
| 4,999,628 A | 3/1991 | Kakaubo et al. |
| 4,999,830 A | 3/1991 | Agazzi |
| 5,077,539 A | 12/1991 | Howatt |
| 5,148,167 A | 9/1992 | Ribner |
| 5,198,814 A | 3/1993 | Ogawara et al. |
| 5,321,758 A | 6/1994 | Charpentier et al. |
| 5,323,159 A | 6/1994 | Imamura et al. |

(Continued)

FOREIGN PATENT DOCUMENTS

| | | |
|---|---|---|
| EP | 0966105 A2 | 12/1999 |
| EP | 1575164 A2 | 9/2005 |

(Continued)

OTHER PUBLICATIONS

International Search Report and Written Opinion, International Application No. PCT/US2015/056357, dated Jan. 29, 2015, 13 pages.

(Continued)

*Primary Examiner* — Hieu Nguyen

(74) *Attorney, Agent, or Firm* — Jackson Walker L.L.P.

(57) ABSTRACT

In accordance with embodiments of the present disclosure, a method may include receiving a digital input signal at a first integrated circuit from a second integrated circuit, receiving a supply voltage at the first integrated circuit from the second integrated circuit, generating an analog output signal from the digital input signal, predicting a distortion of the analog output signal based on the digital input signal and the supply voltage, and controlling a gain applied to at least one of the digital input signal and the analog output signal based on the predicting.

20 Claims, 3 Drawing Sheets

(56) References Cited

U.S. PATENT DOCUMENTS

| | | |
|---|---|---|
| 5,343,161 A | 8/1994 | Tokumo et al. |
| 5,550,923 A | 8/1996 | Hotvet |
| 5,600,317 A | 2/1997 | Knoth et al. |
| 5,714,956 A | 2/1998 | Jahne et al. |
| 5,719,641 A | 2/1998 | Mizoguchi |
| 2,810,477 A | 9/1998 | Abraham et al. |
| 5,808,575 A | 9/1998 | Himeno et al. |
| 6,088,461 A | 7/2000 | Lin |
| 6,201,490 B1 | 3/2001 | Kawano et al. |
| 6,271,780 B1 | 8/2001 | Gong et al. |
| 6,333,707 B1 | 12/2001 | Oberhammer et al. |
| 6,353,404 B1 | 3/2002 | Kuroiwa |
| 6,542,612 B1 | 4/2003 | Needham |
| 6,683,494 B2 * | 1/2004 | Stanley ............ H03F 3/2175 330/10 |
| 6,745,355 B1 | 6/2004 | Tamura |
| 6,768,443 B2 | 7/2004 | Willis |
| 6,822,595 B1 | 11/2004 | Robinson |
| 6,853,242 B2 | 2/2005 | Melanson et al. |
| 6,888,888 B1 | 5/2005 | Tu et al. |
| 6,897,794 B2 | 5/2005 | Kuyel et al. |
| 7,020,892 B2 | 3/2006 | Levesque et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,279,964 B2 | 10/2007 | Bolz et al. |
| 7,302,354 B2 | 11/2007 | Zhuge |
| 7,312,734 B2 | 12/2007 | McNeill et al. |
| 7,315,204 B2 | 1/2008 | Seven |
| 7,365,664 B2 | 4/2008 | Caduff et al. |
| 7,403,010 B1 | 7/2008 | Hertz |
| 7,440,891 B1 | 10/2008 | Shozakai et al. |
| 7,522,677 B2 | 4/2009 | Liang |
| 7,583,215 B2 | 9/2009 | Yamamoto et al. |
| 7,671,768 B2 | 3/2010 | De Ceuninck |
| 7,679,538 B2 | 3/2010 | Tsang |
| 7,893,856 B2 | 2/2011 | Ek et al. |
| 8,060,663 B2 | 11/2011 | Murray et al. |
| 8,130,126 B2 | 3/2012 | Breitschaedel et al. |
| 8,298,425 B2 | 10/2012 | Kanbe |
| 8,330,631 B2 | 12/2012 | Kumar et al. |
| 8,362,936 B2 | 1/2013 | Ledzius et al. |
| 8,462,035 B2 | 6/2013 | Schimper et al. |
| 8,483,753 B2 | 7/2013 | Behzad et al. |
| 8,508,397 B2 | 8/2013 | Hisch |
| 8,717,211 B2 | 5/2014 | Miao et al. |
| 8,786,477 B1 | 7/2014 | Albinet |
| 8,836,551 B2 | 9/2014 | Nozaki |
| 8,873,182 B2 | 10/2014 | Liao et al. |
| 8,878,708 B1 | 11/2014 | Sanders et al. |
| 8,952,837 B2 | 2/2015 | Kim et al. |
| 9,071,267 B1 | 6/2015 | Schneider et al. |
| 9,071,268 B1 | 6/2015 | Schneider et al. |
| 9,118,401 B1 | 8/2015 | Nieto et al. |
| 9,148,164 B1 | 9/2015 | Schneider et al. |
| 9,171,552 B1 | 10/2015 | Yang |
| 9,210,506 B1 | 12/2015 | Nawfal et al. |
| 9,306,588 B2 | 4/2016 | Das et al. |
| 9,337,795 B2 | 5/2016 | Das et al. |
| 9,391,576 B1 | 7/2016 | Satoskar et al. |
| 9,503,027 B2 | 11/2016 | Zanbaghi |
| 9,525,940 B1 | 12/2016 | Schneider et al. |
| 9,543,975 B1 | 1/2017 | Melanson et al. |
| 9,584,911 B2 | 2/2017 | Das et al. |
| 9,596,537 B2 | 3/2017 | He et al. |
| 9,635,310 B2 | 4/2017 | Chang et al. |
| 2001/0001547 A1 | 5/2001 | Delano et al. |
| 2001/0009565 A1 | 7/2001 | Singvall |
| 2004/0078200 A1 | 4/2004 | Alves |
| 2004/0184621 A1 | 9/2004 | Andersen et al. |
| 2005/0258989 A1 | 11/2005 | Li et al. |
| 2005/0276359 A1 | 12/2005 | Xiong |
| 2006/0056491 A1 | 3/2006 | Lim et al. |
| 2006/0064037 A1 | 3/2006 | Shalon et al. |
| 2006/0098827 A1 | 5/2006 | Paddock et al. |
| 2006/0284675 A1 | 12/2006 | Krochmal et al. |
| 2007/0026837 A1 | 2/2007 | Bagchi |
| 2007/0057720 A1 | 3/2007 | Hand et al. |
| 2007/0092089 A1 | 4/2007 | Seefeldt et al. |
| 2007/0103355 A1 | 5/2007 | Yamada |
| 2007/0120721 A1 | 5/2007 | Caduff et al. |
| 2007/0123184 A1 | 5/2007 | Nesimoglu et al. |
| 2008/0030577 A1 | 2/2008 | Cleary et al. |
| 2008/0114239 A1 | 5/2008 | Randall et al. |
| 2008/0143436 A1 * | 6/2008 | Xu .................... H03F 3/217 330/10 |
| 2008/0159444 A1 | 7/2008 | Terada |
| 2008/0198048 A1 | 8/2008 | Klein et al. |
| 2008/0292107 A1 | 11/2008 | Bizjak |
| 2009/0021643 A1 | 1/2009 | Hsueh et al. |
| 2009/0058531 A1 | 3/2009 | Hwang et al. |
| 2009/0084586 A1 | 4/2009 | Nielsen |
| 2009/0220110 A1 | 9/2009 | Bazarjani et al. |
| 2010/0183163 A1 | 7/2010 | Matsui et al. |
| 2011/0013733 A1 | 1/2011 | Martens et al. |
| 2011/0025540 A1 | 2/2011 | Katsis |
| 2011/0029109 A1 | 2/2011 | Thomsen et al. |
| 2011/0063148 A1 | 3/2011 | Kolze et al. |
| 2011/0096370 A1 | 4/2011 | Okamoto |
| 2011/0136455 A1 | 6/2011 | Sundstrom et al. |
| 2011/0150240 A1 | 6/2011 | Akiyama et al. |
| 2011/0170709 A1 | 7/2011 | Guthrie et al. |
| 2011/0188671 A1 | 8/2011 | Anderson et al. |
| 2011/0228952 A1 | 9/2011 | Lin |
| 2011/0242614 A1 | 10/2011 | Okada |
| 2011/0268301 A1 | 11/2011 | Nielsen et al. |
| 2011/0285463 A1 | 11/2011 | Walker et al. |
| 2012/0001786 A1 | 1/2012 | Hisch |
| 2012/0047535 A1 | 2/2012 | Bennett et al. |
| 2012/0133411 A1 | 5/2012 | Miao et al. |
| 2012/0177201 A1 | 7/2012 | Ayling et al. |
| 2012/0177226 A1 | 7/2012 | Silverstein et al. |
| 2012/0188111 A1 | 7/2012 | Ledzius et al. |
| 2012/0207315 A1 | 8/2012 | Kimura et al. |
| 2012/0242521 A1 | 9/2012 | Kinyua |
| 2012/0250893 A1 | 10/2012 | Carroll et al. |
| 2012/0263090 A1 | 10/2012 | Porat et al. |
| 2012/0280726 A1 | 11/2012 | Colombo et al. |
| 2013/0095870 A1 | 4/2013 | Phillips et al. |
| 2013/0106635 A1 | 5/2013 | Doi |
| 2013/0129117 A1 | 5/2013 | Thomsen et al. |
| 2013/0188808 A1 | 7/2013 | Pereira et al. |
| 2013/0241753 A1 | 9/2013 | Nozaki |
| 2013/0241755 A1 | 9/2013 | Chen et al. |
| 2014/0044280 A1 | 2/2014 | Jiang |
| 2014/0105256 A1 | 4/2014 | Hanevich et al. |
| 2014/0105273 A1 | 4/2014 | Chen et al. |
| 2014/0126747 A1 | 5/2014 | Huang |
| 2014/0135077 A1 | 5/2014 | Leviant et al. |
| 2014/0184332 A1 | 7/2014 | Shi et al. |
| 2014/0269118 A1 | 9/2014 | Taylor et al. |
| 2014/0368364 A1 | 12/2014 | Hsu |
| 2015/0170663 A1 | 6/2015 | Disch et al. |
| 2015/0214974 A1 | 7/2015 | Currivan |
| 2015/0214975 A1 | 7/2015 | Gomez et al. |
| 2015/0249466 A1 | 9/2015 | Elyada |
| 2015/0295584 A1 | 10/2015 | Das et al. |
| 2015/0381130 A1 | 12/2015 | Das et al. |
| 2016/0072465 A1 | 3/2016 | Das et al. |
| 2016/0080862 A1 | 3/2016 | He et al. |
| 2016/0080865 A1 | 3/2016 | He et al. |
| 2016/0173112 A1 | 6/2016 | Das et al. |
| 2016/0286310 A1 | 9/2016 | Das et al. |
| 2016/0365081 A1 | 12/2016 | Satoskar et al. |
| 2017/0047895 A1 | 2/2017 | Zanbaghi |
| 2017/0150257 A1 | 5/2017 | Das et al. |

FOREIGN PATENT DOCUMENTS

| | | |
|---|---|---|
| EP | 1753130 A1 | 2/2007 |
| EP | 1798852 A2 | 6/2009 |
| EP | 2207264 A1 | 7/2010 |
| GB | 1599401 A | 9/1981 |

(56) References Cited

FOREIGN PATENT DOCUMENTS

| | | |
|---|---|---|
| GB | 2119189 A | 11/1983 |
| GB | 2307121 A | 6/1997 |
| GB | 2507096 A | 4/2014 |
| GB | 2527637 A | 12/2015 |
| GB | 2527677 B | 10/2016 |
| GB | 2539517 A | 12/2016 |
| JP | 2008294803 A | 12/2008 |
| WO | WO0054403 A1 | 9/2000 |
| WO | 02/37686 A2 | 5/2002 |
| WO | 2008067260 A1 | 6/2008 |
| WO | 2014113471 A1 | 7/2014 |
| WO | 2015160655 | 10/2015 |
| WO | 2016040165 A1 | 3/2016 |
| WO | 2016040171 A1 | 3/2016 |
| WO | 2016040177 A1 | 3/2016 |
| WO | 2016160336 A1 | 10/2016 |
| WO | 2016202636 A1 | 12/2016 |

OTHER PUBLICATIONS

Combined Search and Examination Report, GB Application No. GB1514512.1, dated Feb. 11, 2016, 7 pages.
International Search Report and Written Opinion, International Application No. PCT/US2015/048609, dated Mar. 23, 2016, 23 pages.
International Search Report and Written Opinion, International Application No. PCT/US2016/022578, dated Jun. 22, 2016, 12 pages.
Combined Search and Examination Report, GB Application No. GB1600528.2, dated Jul. 7, 2016, 8 pages.
Combined Search and Examination Report, GB Application No. GB1602288.1, dated Aug. 9, 2016, 6 pages.
International Search Report and Written Opinion of the International Searching Authority, International Application No. PCT/US2016/065134, dated Mar. 15, 2017.
Combined Search and Examination Report, GB Application No. GB1603628.7, dated Aug. 24, 2016, 6 pages.
International Search Report and Written Opinion, International Application No. PCT/EP2016/062862, dated Aug. 26, 2016, 14 pages.
Thaden, Rainer et al., A Loudspeaker Management System with FIR/IRR Filtering; AES 32nd International Conference, Hillerod, Denmark, Sep. 21-23, 2007; pp. 1-12.
Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.
GB Patent Application No. 1419651.3, Improved Analogue-to-Digital Convertor, filed Nov. 4, 2014, 65 pages.
Combined Search and Examination Report, GB Application No. GB1506258.1, dated Oct. 21, 2015, 6 pages.
International Search Report and Written Opinion, International Patent Application No. PCT/US2015/025329, dated Aug. 11, 2015, 9 pages.
International Search Report and Written Opinion, International Patent Application No. PCT/US2015/048633, dated Dec. 10, 2015, 11 pages.
International Search Report and Written Opinion, International Patent Application No. PCT/US2015/048591, dated Dec. 10, 2015, 11 pages.
Combined Search and Examination Report, GB Application No. GB1510578.6, dated Aug. 3, 2015, 3 pages.
Combined Search and Examination Report under Sections 17 and 18(3) of the UKIPO, Application No. GB1620427.3, dated Jun. 1, 2017.
Combined Search and Examination Report under Sections 17 and 18(3) of the UKIPO, Application No. GB1620428.1, dated Jul. 21, 2017.
Combined Search and Examination Report under Sections 17 and 18(3) of the UKIPO, Application No. GB1700371.6, dated Aug. 1, 2017.
International Search Report and Written Opinion of the International Searching Authority, International Application No. PCT/US2016/040096, dated Mar. 24, 2017.
International Search Report and Written Opinion of the International Searching Authority, International Application No. PCT/US2017/014240, dated Apr. 24, 2017.
Groeneweg, B.P., et al., A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-1016.
Chen, K., et al., A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.
Chen, Kuo-Hsin, et al., A 106dB PSRR Direct Battery Connected Reconfigurable Class-AB/D Speaker Amplifier for Hands-Free/Receiver 2-in-1 Loudspeaker, Solid State Circuits Conference (A-SSCC), 2011 IEEE Asian, Nov. 14, 2011, pp. 221-224.
International Search Report and Written Opinion of the International Searching Authority, International Patent Application No. PCT/US2017/045861, dated Nov. 14, 2017.
International Search Report and Written Opinion of the International Searching Authority, International Patent Application No. PCT/US2017/046083, dated Nov. 14, 2017.
Combined Search and Examination Report under Sections 17 and 18(3), United Kingdom Intellectual Property Office, Application No. GB1708546.5, dated Nov. 22, 2017.
Combined Search and Examination Report under Sections 17 and 18(3), United Kingdom Intellectual Property Office, Application No. GB1708544.0, dated Nov. 28, 2017.
International Search Report and Written Opinion of the International Searching Authority, International Patent Application No. PCT/US2017/052439, dated Dec. 14, 2017.

* cited by examiner

SYSTEMS AND METHODS FOR PREVENTING DISTORTION DUE TO SUPPLY-BASED MODULATION INDEX CHANGES IN AN AUDIO PLAYBACK SYSTEM

FIELD OF DISCLOSURE

The present disclosure relates in general to circuits for audio devices, including without limitation personal audio devices such as wireless telephones and media players, and more specifically, to systems and methods for reducing signal distortion in an audio signal path in an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

In some personal audio devices, changes in a modulation index of a signal processing circuit may lead to signal distortion, such as a signal being clipped by a supply voltage providing power to the signal processing circuit.

SUMMARY

In accordance with the teachings of the present disclosure, one or more disadvantages and problems associated with existing approaches to avoiding signal distortion in a signal processing system may be reduced or eliminated.

In accordance with embodiments of the present disclosure, a signal processing system may include a digital input for receiving a digital input signal, a digital-to-analog conversion stage powered from a reference voltage and coupled to the input gain control stage configured to convert the digital input signal into an intermediate analog signal, a modulation stage coupled to the digital-to-analog conversion stage wherein the digital-to-analog conversion stage controls the modulation stage to generate a pre-driver signal, a driver stage powered from a supply voltage via at least one supply voltage terminal and coupled to the modulation stage and configured to generate the analog output signal from the pre-driver signal; and a predictor configured to predict a distortion of the analog output signal and control a gain applied to at least one of the digital input signal and the analog output signal based on the prediction such that the predicted distortion is averted. The predictor may predict the distortion of the analog output signal based on at least one of the digital input signal, the reference voltage, the supply voltage, a current of the at least one supply voltage terminal, a reference voltage frequency, a supply voltage frequency, a current frequency of the current, and an impedance of a load coupled to an output of the driver stage.

In accordance with these and other embodiments of the present disclosure, a method may include predicting a distortion of an analog output signal generated from a digital input signal and controlling a gain applied to at least one of the digital input signal and the analog output signal based on the prediction such that the predicted distortion is averted. Predicting the distortion may comprise of the analog output signal based on at least one of the digital input signal, a reference voltage for powering a digital-to-analog conversion stage coupled to the input gain control stage configured to convert the digital input signal into an intermediate analog signal that is input to a modulation stage such that the digital-to-analog conversion stage controls the modulation stage to generate a pre-driver signal, a supply voltage for powering a driver stage coupled to the modulation stage and configured to generate the analog output signal from the pre-driver signal (wherein the driver stage is powered from the supply voltage via at least one supply voltage terminal), a current of the at least one supply voltage terminal, a reference voltage frequency, a supply voltage frequency, a current frequency of the current, and an impedance of a load coupled to an output of the driver stage.

In accordance with these and other embodiments of the present disclosure, a method may include receiving a digital input signal at a first integrated circuit from a second integrated circuit, receiving a supply voltage at the first integrated circuit from the second integrated circuit, generating an analog output signal from the digital input signal, predicting a distortion of the analog output signal based on the digital input signal and the supply voltage, and controlling a gain applied to at least one of the digital input signal and the analog output signal based on the predicting.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

In accordance with embodiments of the present disclosure, an integrated circuit for use in an audio device, such as a personal audio device (e.g., mobile telephone, portable music player, tablet computer, personal digital assistant, etc.), may include a signal path having a digital path portion (e.g., an audio compressor) and an analog path portion (e.g., an audio expander). The analog path portion may include an amplifier to receive an analog signal generated by the digital path portion and apply a gain to the analog signal to generate an output signal, wherein said output signal may be communicated to a loudspeaker for playback and/or to other circuitry for processing.

Figure 1:
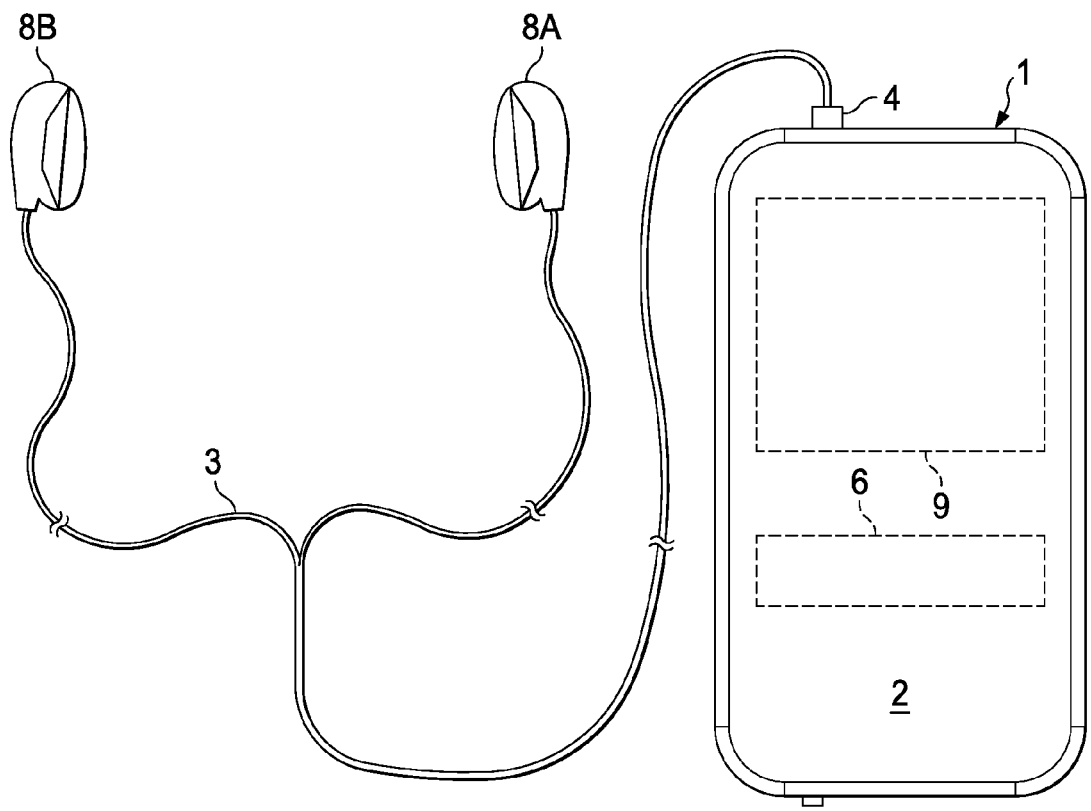
FIG. 1 is an illustration of an example personal audio device, in accordance with embodiments of the present disclosure.

The integrated circuit described above may be used in any suitable system, device, or apparatus, including without limitation, a personal audio device. FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer. In addition, personal audio device 1 may include digital IC 6 for generating a digital audio signal. Digital IC 6 may include any suitable number and type of digital components, including for example one or more processors, controllers, memories, etc.

Figure 2:
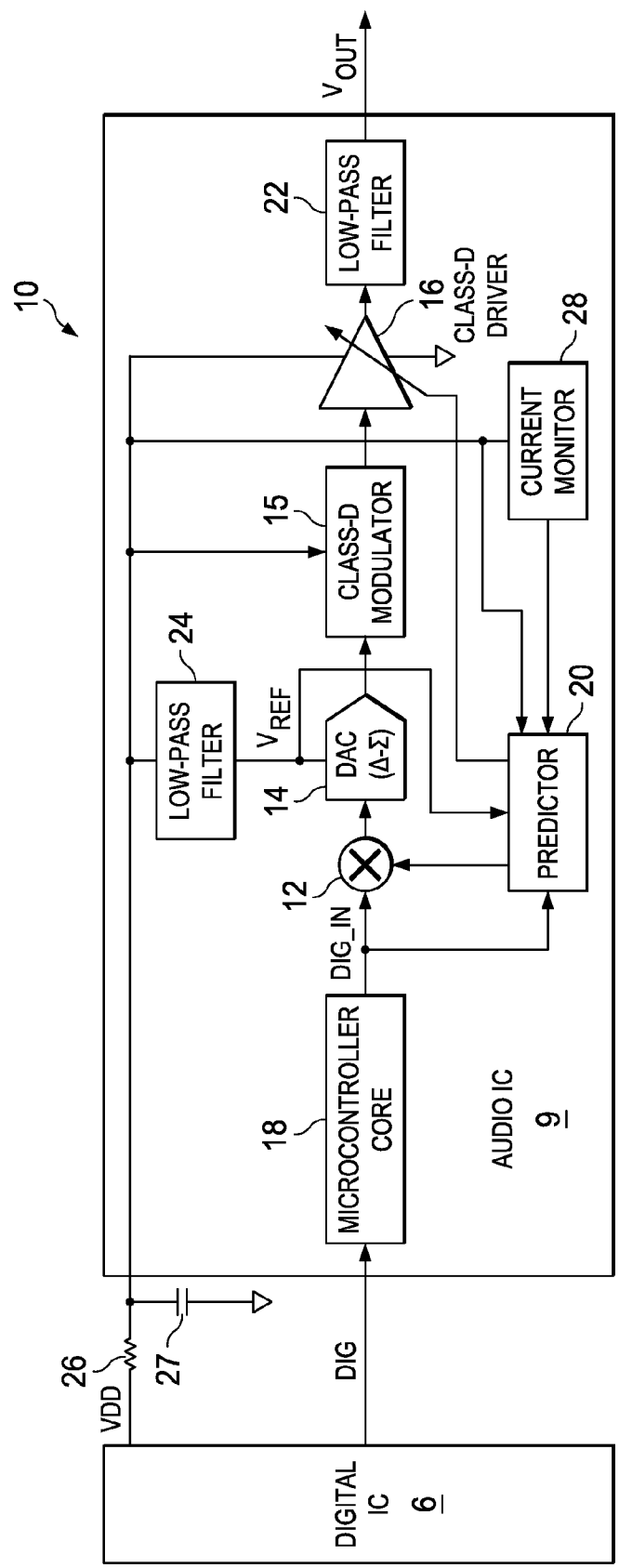
FIG. 2 is a block diagram of selected components of an example signal processing system of a personal audio device, in accordance with embodiments of the present disclosure.

FIG. 2 is a block diagram of selected components of a signal processing system 10 of personal audio device 1, wherein the signal processing system comprises digital IC 6 and example audio IC 9, in accordance with embodiments of the present disclosure. As shown in FIG. 2, digital IC 6 may supply a digital audio signal DIG and a supply voltage VDD to audio IC 9. As shown in FIG. 2, parasitic impedances (e.g., parasitic resistance 26 and parasitic capacitance) may be present on a transmission line for supply voltage VDD which may cause degradation in the supply voltage within audio IC 9. A microcontroller core 18 may perform digital processing on digital audio signal DIG and output a digital audio input signal DIG_IN to a gain element 12 to apply a digital gain controlled by predictor 20 to the digital input signal DIG_IN. The amplified digital audio input signal may be communicated to a digital-to-analog converter (DAC) 14, which may convert the digital audio input signal to an intermediate analog signal. DAC 14 may comprise any suitable system, device, or apparatus configured to convert a digital signal into a corresponding analog signal indicative of the digital signal. In some embodiments, DAC 14 may comprise a delta-sigma modulator. As shown in FIG. 2, DAC 14 may be powered from a reference voltage VREF. In some embodiments, supply voltage VDD provided by digital IC 6 may be low-pass filtered by low-pass filter 24 to generate reference voltage VREF. Such low-pass filtering may provide for reference voltage VREF to have less variation than that of supply voltage VDD. Together, gain element 12 and DAC 14 may be referred to herein as a digital signal path portion of the signal path from the input node for digital audio input signal DIG_IN to the output node for output voltage signal $V_{OUT}$ depicted in FIG. 2.

DAC 14 may supply the intermediate analog signal to a Class-D modulator 15, such that the intermediate analog signal controls Class-D modulator 15 in order to generate an analog pre-driver signal. For example, in some embodiments, Class-D modulator 15 may generate the pre-driver signal as a pulse-width modulated signal, wherein the pulse widths of the pre-driver signal are a function of the intermediate analog signal. As shown in FIG. 2, Class-D modulator 15 may be powered from supply voltage VDD provided by digital IC 6 via at least one supply voltage terminal of Class-D modulator 15.

A Class-D driver 16 may receive the pre-driver signal and output an analog signal that may be filtered by a low-pass filter 22 to generate analog output signal $V_{OUT}$, which may be driven to a transducer (e.g., one or more of speakers 8A and 8B) for playback of audio sound. Thus, together Class-D driver 16 and low-pass filter 22 form a driver stage configured to generate analog output signal $V_{OUT}$ from the pre-driver signal output by Class-D modulator 15. As shown in FIG. 2, Class-D driver 16 may be powered from supply voltage VDD provided by digital IC 6 via at least one supply voltage terminal of Class-D driver 16. As also shown in FIG. 2, Class-D driver 16 may have an analog gain applied to analog output signal $V_{OUT}$, wherein such analog gain is controlled by predictor 20. Although the embodiment in FIG. 2 depicts an analog gain applied by Class-D driver 16, in other embodiments, an analog gain may be applied at any other portion of the analog path portion comprising Class-D modulator 15, Class-D driver 16, and low-pass filter 22.

As depicted in FIG. 2, audio IC 9 may include a current monitor 28, which may include any system, device, or apparatus configured to detect a current flowing to a power supply input to Class-D driver 16. Current monitor 28 may communicate a signal indicative of such monitored current to predictor 20.

As shown in FIG. 2, audio IC 9 may include a predictor 20. Predictor 20 may be configured to predict a distortion (e.g., signal clipping) of analog output signal $V_{OUT}$ and control one or both of a digital gain applied to at least one of the digital input signal DIG_IN (e.g., by gain element 12) and an analog gain applied to analog output signal $V_{OUT}$ (e.g., by Class-D driver 16) based on the prediction such that the predicted distortion is averted. Predictor 20 may predict the distortion based on at least one of a digital audio input signal DIG_IN, reference voltage VREF, supply voltage VDD, a current of at least one supply voltage terminal of Class-D modulator 15 or Class-D driver 16, a frequency associated with reference voltage VREF, a frequency associated with supply voltage VDD, a frequency associated with the current of the at least one supply voltage terminal of Class-D modulator 15 or Class-D driver 16, and an impedance of a load coupled to an output of audio IC 9. In some embodiments, predictor 20 may predict distortion based on current and/or previously-detected values (e.g., stored in a memory not explicitly shown in FIG. 2) of one or more of the various parameters listed in the previous sentence. For example, based on one or more of these parameters, predictor 20 may predict that analog output signal $V_{OUT}$ is likely to exceed supply voltage VDD, thus causing signal clipping if the distortion is not averted by reducing signal gain. To make such prediction, predictor 20 may rely on present instantaneous values of digital audio input signal DIG_IN and supply voltage VDD and/or may rely on one or more previous values of such parameters to predict whether distortion is imminent based on a rate of change of such parameters.

Figure 3:
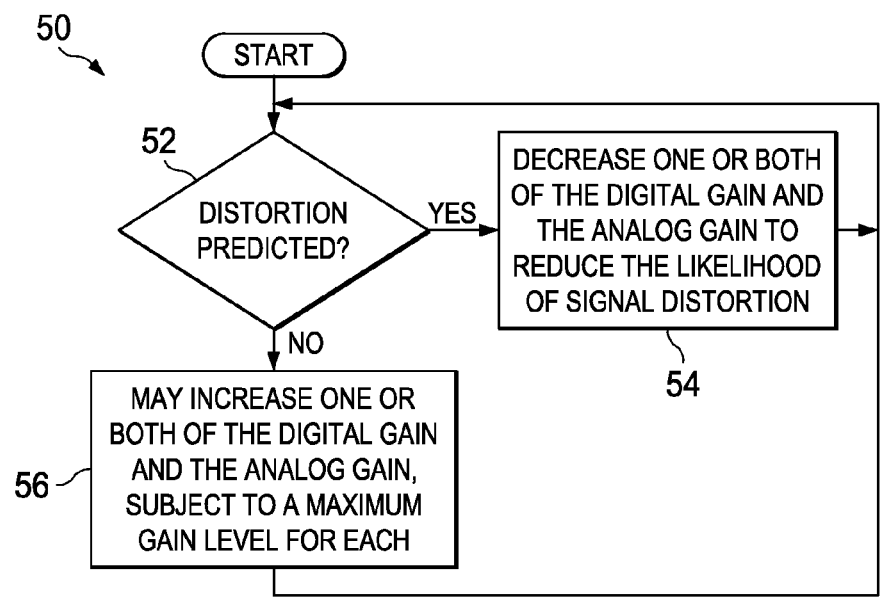
FIG. 3 illustrates a flow chart of an example method for reducing distortion in a personal audio device, in accordance with embodiments of the present disclosure.

FIG. 3 illustrates a flow chart of an example method 50 for reducing distortion in a personal audio device, in accordance with embodiments of the present disclosure. According to one embodiment, method 50 may begin at step 52. As noted above, teachings of the present disclosure may be implemented in a variety of configurations of signal processing system 10.

Figure 4:
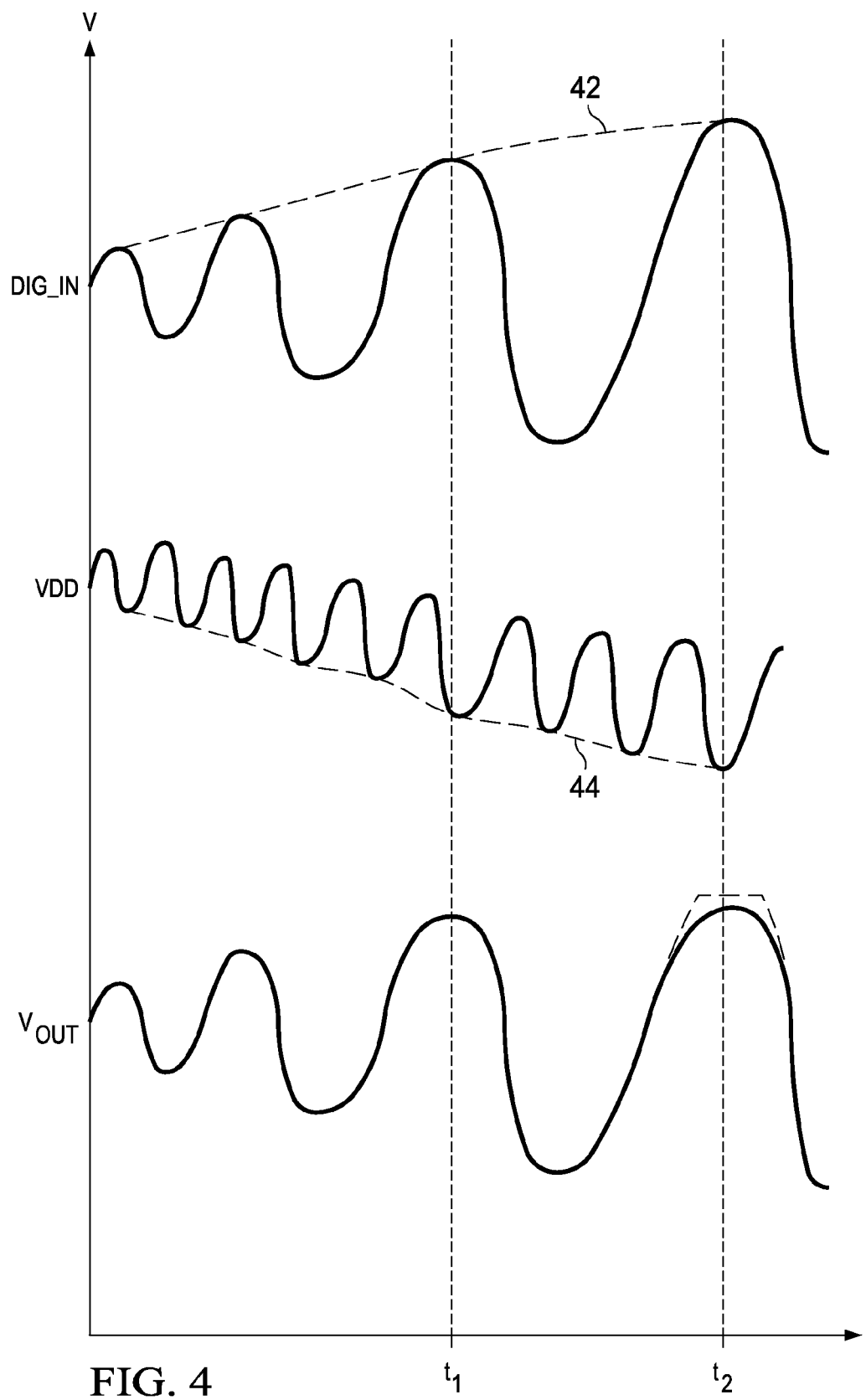
FIG. 4 illustrates an example graph of waveforms for a digital input signal and a supply voltage showing an example of predicting distortion and avoiding such distortion in the signal processing system of FIG. 2, in accordance with embodiments of the present disclosure.

At step 52, predictor 20 may determine if distortion is likely. If distortion is imminent, method 50 may proceed to step 54. Otherwise, if distortion is not imminent, method 50 may proceed to step 56. An example of predicting distortion is shown in FIG. 4, which illustrates an example graph of waveforms for digital audio input signal DIG_IN and supply voltage VDD taken at a power supply input of Class-D driver 16, showing an example of predicting distortion and avoiding such distortion in signal processing system 10, in accordance with embodiments of the present disclosure. FIG. 4 depicts digital audio input signal DIG_IN having an increasing magnitude and a supply voltage VDD decreasing in magnitude. Thus, based on envelope 42 of digital audio input signal DIG_IN and envelope 44 of supply voltage VDD, predictor 20 may at time $t_1$ predict a future distortion event (e.g., overload or clipping of an audio signal somewhere in the audio signal path) could occur based on such envelopes. Accordingly, as a result of such predicted distortion, predictor 20 may decrease one or both of the digital gain and the analog gain to reduce the likelihood of signal distortion. As a result, analog output signal $V_{OUT}$ may avoid distortion (e.g., signal clipping as shown by dotted line for output signal $V_{OUT}$ in FIG. 4) that may have otherwise occurred due to the decreasing supply voltage VDD.

Although the foregoing paragraph contemplates that a priori indications of digital audio input signal DIG_IN and supply voltage VDD may be used to predict and avoid future distortion (e.g., clipping or other audio artifact), other a priori measurements (e.g., at least one of digital audio input signal DIG_IN, reference voltage VREF, supply voltage VDD, a current of at least one supply voltage terminal of Class-D modulator 15 or Class-D driver 16, a frequency associated with reference voltage VREF, a frequency associated with supply voltage VDD, a frequency associated with the current of the at least one supply voltage terminal of Class-D modulator 15 or Class-D driver 16, and an impedance of a load coupled to an output of audio IC 9) may be used to predict and avoid future distortion.

Turning again to FIG. 3, at step 54, in response to a prediction of distortion, predictor 20 may decrease one or both of the digital gain and the analog gain to reduce the likelihood of signal distortion. After completion of step 54, method 50 may proceed again to step 52.

At step 56, in response to predicting absence of distortion, predictor 20 may increase one or both of the digital gain and the analog gain, subject to a maximum gain level for each. After completion of step 56, method 50 may proceed again to step 52.

Although FIG. 3 discloses a particular number of steps to be taken with respect to method 50, method 50 may be executed with greater or lesser steps than those depicted in FIG. 3. In addition, although FIG. 3 discloses a certain order of steps to be taken with respect to method 50, the steps comprising method 50 may be completed in any suitable order.

Method 300 may be implemented using signal processing system 10 or any other system operable to implement method 300. In certain embodiments, method 300 may be implemented partially or fully in software and/or firmware embodied in computer-readable media.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A signal processing system comprising:
   a digital input for receiving a digital input signal;
   a digital-to-analog conversion stage coupled to an input gain control stage configured to convert the digital input signal into an intermediate analog signal, wherein the digital-to-analog conversion stage is configured to be powered from a reference voltage;
   a modulation stage coupled to the digital-to-analog conversion stage wherein the digital-to-analog conversion stage is configured to control the modulation stage to generate a pre-driver signal;
   a driver stage coupled to the modulation stage and configured to generate an analog output signal from the pre-driver signal, wherein the driver stage is configured to be powered from a supply voltage via at least one supply voltage terminal; and
   a predictor configured to predict a clipping distortion of the analog output signal based at least in part on a predicted decline in the supply voltage and control a gain applied to at least one of the digital input signal and the analog output signal based on the predicted clipping distortion such that the predicted clipping distortion is averted, wherein the clipping distortion is further predicted based at least in part on a previously detected value of at least one of the digital input signal, the reference voltage, the supply voltage, a current of the at least one supply voltage terminal, a reference voltage frequency, a supply voltage frequency, a current frequency of the current, or an impedance of a load coupled to an output of the amplifier.

2. The signal processing system of claim 1, wherein the digital-to-analog conversion stage comprises a delta-sigma modulator.

3. The signal processing system of claim 1, wherein the modulation stage comprises a Class D modulator configured to generate the pre-driver signal as a pulse-width modulated signal.

4. The signal processing system of claim 3, wherein the driver stage comprises a Class D driver.

5. The signal processing system of claim 1, wherein the supply voltage is configured to be low-pass filtered to generate the reference voltage.

6. The signal processing system of claim 1, wherein the supply voltage and the reference voltage are distinct.

7. The signal processing system of claim 1, wherein:
the signal processing system is integral to a first integrated circuit; and
the first integrated circuit is configured to receive the digital input signal and the supply voltage from a second integrated circuit.

8. A method comprising:
predicting a clipping distortion of an analog output signal generated by an amplifier from a digital input signal;
controlling a gain applied by at least one stage of the amplifier to at least one of the digital input signal and the analog output signal based on the prediction such that the predicted clipping distortion is averted, wherein the at least one stage is powered by a supply voltage; and
generating a reference voltage by applying a low-pass filter to the supply voltage;
wherein the predicting the clipping distortion of the analog output signal comprises predicting based at least in part on a predicted decline in the supply voltage and further based at least in part on a monitored voltage difference between the supply voltage and the reference voltage.

9. The method of claim 8, wherein the amplifier includes a delta-sigma modulator.

10. The method of claim 8, wherein the amplifier includes a Class D modulator configured to generate a pre-driver signal as a pulse-width modulated signal.

11. The method of claim 10, wherein a driver stage configured to receive the pre-driver signal comprises a Class D driver.

12. The method of claim 8, wherein the monitored voltage difference between the supply voltage and the reference voltage is an instantaneous voltage difference.

13. The method of claim 8, wherein a switching amplifier is integral to a first integrated circuit and the method further comprises the first integrated circuit receiving the digital input signal and the supply voltage from a second integrated circuit.

14. The method of claim 8, further comprising predicting the clipping distortion of the analog output signal based on a previously-detected value of at least one of the digital input signal, a reference voltage, the supply voltage, a current of at least one supply voltage terminal, a reference voltage frequency, a supply voltage frequency, a current frequency of the current, or an impedance of a load coupled to an output of the amplifier.

15. A method comprising:
receiving a digital input signal at a first integrated circuit from a second integrated circuit;
receiving a supply voltage at the first integrated circuit from the second integrated circuit;
generating an analog output signal from the digital input signal;
predicting a clipping distortion of the analog output signal based on the digital input signal and a predicted decline in the supply voltage, wherein the clipping distortion is further predicted based at least in part on a previously detected value of at least one of the digital input signal, a reference voltage, the supply voltage, a current of at least one supply voltage terminal, a reference voltage frequency, a supply voltage frequency, a current frequency of the current, or an impedance of a load coupled to an output of the amplifier; and
controlling a gain applied to at least one of the digital input signal and the analog output signal based on the predicting.

16. The method of claim 15, wherein generating the analog output signal from the digital input signal comprises:
converting the digital input signal into an intermediate analog signal by a digital-to-analog conversion stage, wherein the digital-to-analog conversion stage is powered from a reference voltage;
generating a pre-driver signal by a modulation stage coupled to the digital-to-analog conversion stage wherein the digital-to-analog conversion stage controls the modulation stage to generate the pre-driver signal; and
generating the analog output signal from the pre-driver signal by a driver stage coupled to the modulation stage, wherein the digital-to-analog conversion stage is powered from the supply voltage via at least one supply voltage terminal.

17. The method claim 16, wherein the digital-to-analog conversion stage comprises a delta-sigma modulator.

18. The method of claim 16, wherein the modulation stage comprises a Class D modulator configured to generate the pre-driver signal as a pulse-width modulated signal.

19. The method of claim 18, wherein the driver stage comprises a Class D driver.

20. The method claim 16, wherein the supply voltage is low-pass filtered to generate the reference voltage.

* * * * *